United States Patent
Raghunathan et al.

(10) Patent No.: US 8,159,888 B2
(45) Date of Patent: Apr. 17, 2012

(54) RECALIBRATION SYSTEMS AND TECHNIQUES FOR ELECTRONIC MEMORY APPLICATIONS

(75) Inventors: Ashwin Raghunathan, Santa Clara, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 254 days.

(21) Appl. No.: 12/714,767

(22) Filed: Mar. 1, 2010

(65) Prior Publication Data

US 2011/0211404 A1    Sep. 1, 2011

(51) Int. Cl.
 *G11C 7/00*    (2006.01)
(52) U.S. Cl. ......................................... 365/193; 365/194
(58) Field of Classification Search .................. 365/193, 365/194, 233.13; 326/30, 26
See application file for complete search history.

(56) References Cited

U.S. PATENT DOCUMENTS

| | | | |
|---|---|---|---|
| 6,316,980 B1 | 11/2001 | Vogt et al. | |
| 7,872,494 B2 * | 1/2011 | Welker et al. | 326/30 |
| 2004/0222828 A1 | 11/2004 | Ishikawa | |
| 2005/0047192 A1 * | 3/2005 | Matsui et al. | 365/145 |
| 2008/0201597 A1 | 8/2008 | Chong et al. | |

OTHER PUBLICATIONS

International Search Report and Written Opinion—PCT/US2011/026537, ISA/EPO—Jul. 8, 2011.

* cited by examiner

*Primary Examiner* — Vu Le
(74) *Attorney, Agent, or Firm* — Nicholas J. Pauley; Peter M. Kamarchik; Jonathan T. Velasco (57) ABSTRACT

A memory circuit includes a delay module receiving a strobe signal and producing a delayed strobe signal therefrom. The memory circuit also includes a calibration module that initiates recalibration of the delay module when the calibration module discerns that the delayed strobe signal is within a predetermined proximity of an edge of a reference signal. The memory circuit can be included in a memory interface. Furthermore, in some embodiments, a strobe signal can be used as the reference signal.

23 Claims, 7 Drawing Sheets

RECALIBRATION SYSTEMS AND TECHNIQUES FOR ELECTRONIC MEMORY APPLICATIONS

TECHNICAL FIELD

The present description is related to electronic memory applications and is related, more specifically, to interface circuitry for a high-speed I/O Double Data Rate (DDR) Random Access Memory (RAM) application.

BACKGROUND

High-speed I/O interfaces between processors and double-data rate (DDR) SDRAM accommodate data transitions on both the rising and falling edges of the clock. Such interfaces work across a variety of process, voltage, and temperature (PVT) conditions with a tight "data-valid" window. This data-valid window can be significantly less than a half-clock period due to effects such as duty cycle distortion, timing uncertainty (jitter), setup/hold requirements, and the like.

Figure 1:
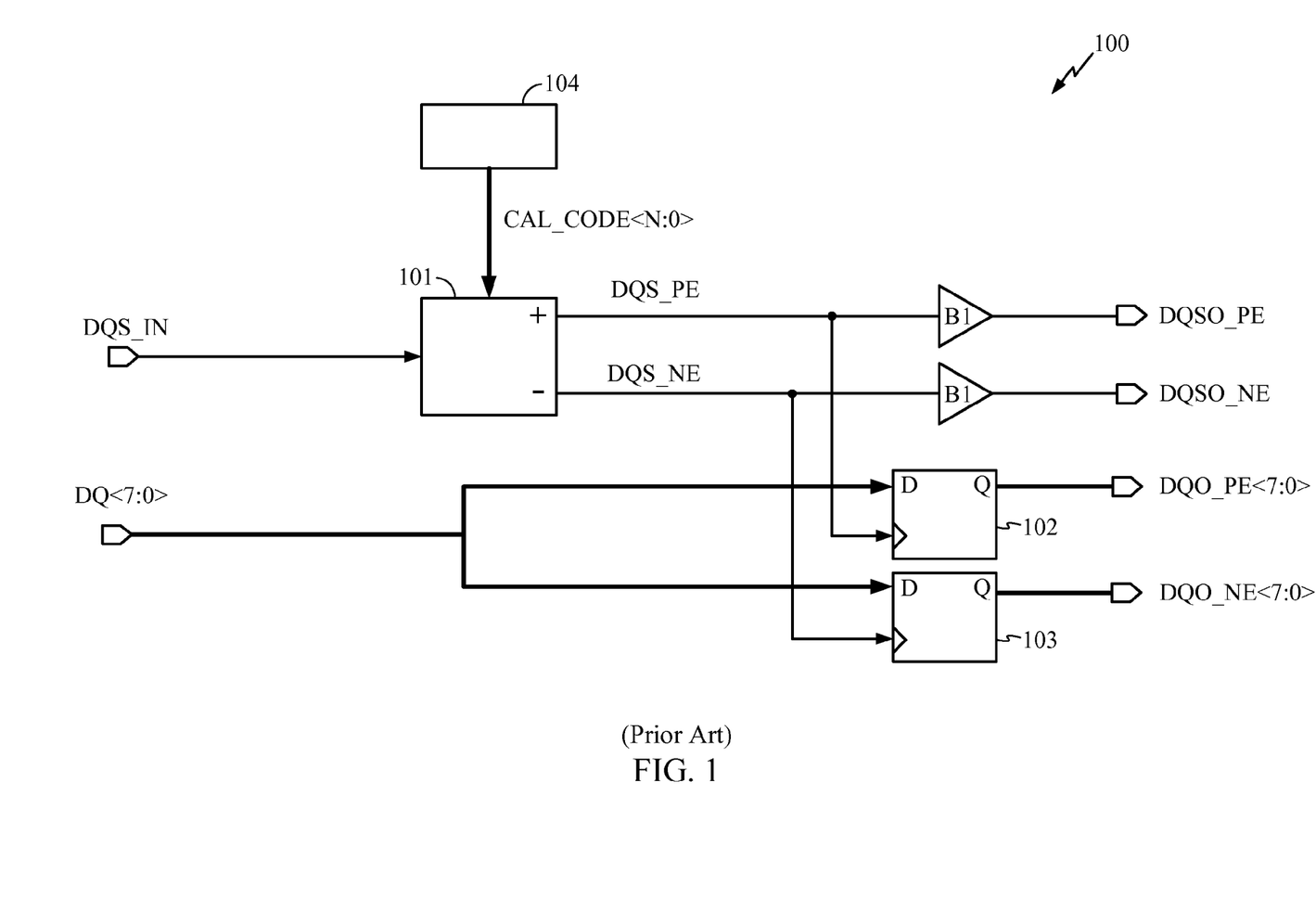
FIG. 1 is an illustration of a conventional Calibrated Delay Circuit (CDC) for use in the READ path between a processor and a double-data rate (DDR) Synchronous Dynamic Random Access Memory (SDRAM).

FIG. 1 is an illustration of a conventional Calibrated Delay Circuit (CDC) 100 for use in the READ path between a processor (not shown) and a double-data rate (DDR) Synchronous Dynamic Random Access Memory (SDRAM) (also not shown). The CDC 100 uses a programmable delay array 101 that has delay elements therein. Various ones of the delay elements in the programmable delay array 101 can be enabled or disabled in order to increase or decrease (respectively) the delay of the incoming strobe (DQS_IN) with respect to the data (DQ) by a time $T_{SD}$. The programmable delay array 101 produces positive and negative delayed strobes (DQS_PE and DQS_NE), which are used by latches 102, 103 to latch incoming double data rate data (DQ) to produce latched data (DQO_PE) and (DQO_NE). The value of $T_{SD}$ can be chosen so that edges of the delayed strobes (DQS_PE and DQS_NE) fall approximately in the center of a data valid window for a given operating frequency.

A calibration engine 104 is used to select the number of programmable delay elements in the programmable delay array 101 for a given PVT condition to produce $T_{SD}$. The information indicating the selected number of delay elements is conveyed to the programmable delay array by means of a calibration code, CAL_CODE<N:0>, in this example.

Figure 2:
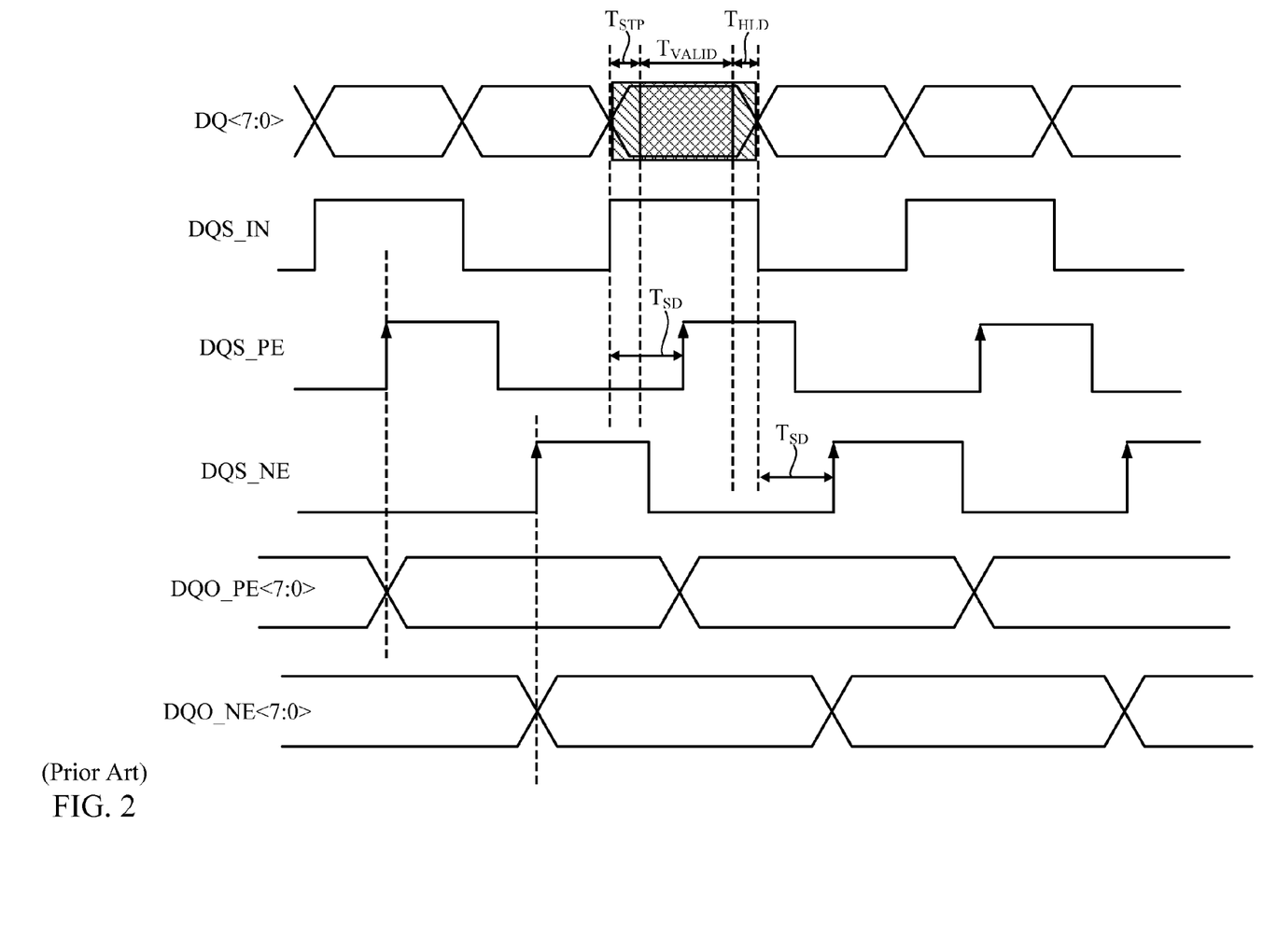
FIG. 2 is an illustration of associated waveforms for the CDC of FIG. 1.

FIG. 2 is an illustration of associated waveforms for the CDC 100 of FIG. 1. $T_{STP}$ is a set up time for the data, and $T_{HLD}$ is a hold time for the data. The data valid window ($T_{VALID}$) is the time between the setup time and the hold time, and it represents the span of time when the data is best latched. In FIG. 2, the rising edge of the positive delayed strobe (DQS_PE) is shown falling within the data valid window, thereby allowing the data to be latched correctly as DQO_PE. Although the data valid window is not shown in adjacent data segments, it is apparent in FIG. 2 that the rising edge of the negative delayed strobe (DQS_NE) is shown falling within the data valid window as well, thereby allowing the data to be latched correctly as DQO_NE.

As mentioned above, the CDC 100 selects the number of programmable delay array elements to ensure that the delayed strobes DQS_PE and DQS_NE are centered within the data valid window for given PVT conditions. In practice, the temperature will change depending upon ambient conditions, and the processor supply voltage is intentionally scaled up or scaled down depending on the usage mode of the processor (e.g., high performance, low power, etc).

Changes in temperature and supply voltage can cause DQS_PE and DQS_NE to deviate from their centered positions within the data valid window. In fact, a significant change in supply voltage or temperature could cause DQS_PE and DQS_NE to fall outside the data valid window, thereby resulting in a memory access failure. One proposed solution is to operate the calibration engine 104 continuously so that the calibration code continuously tracks changes in supply voltage and temperature even if they are small changes. However, continuous operation of the calibration engine 104 will result in increased power consumption. Also, continuous operation of the calibration engine 104 will result in calibration code updates even in response to insignificant changes in supply voltage and temperature for which DQS_PE and DQS_NE would still remain within the data valid window. As memory access operations have to be suspended whenever the calibration code is being updated by the calibration engine 104, continuous operation of the calibration engine will add latency and reduce overall system performance.

BRIEF SUMMARY

In one embodiment, a memory interface circuit includes a delay module receiving a strobe signal and producing a delayed strobe signal therefrom. The memory circuit also includes a calibration module that initiates recalibration of the delay module when the calibration module discerns that the delayed strobe signal is within a predetermined proximity of an edge of a reference signal.

In another embodiment, a method for use in a memory interface circuit that includes a strobe delay component is provided. The method includes discerning a position of a delayed strobe signal relative to a reference signal. In response to discerning that the delayed strobe signal is within a predetermined proximity of the reference signal, a recalibration of the strobe delay component is initiated.

In another embodiment, a method for use in a memory interface circuit that includes a strobe delay component is provided. The method includes the step discerning a position of a delayed strobe signal relative to a reference signal. In response to discerning that the delayed strobe signal is within a predetermined proximity of the reference signal, the method further includes the step of initiating a recalibration of the strobe delay component.

In yet another embodiment, a memory interface module includes means for receiving a strobe signal and producing a delayed strobe signal therefrom. The memory interface module also includes means for initiating recalibration of the delay producing means when it is discerned that the delayed strobe signal is within a predetermined proximity of an edge of a reference signal.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying fig-

BRIEF DESCRIPTION OF THE DRAWINGS

For a more complete understanding of the present disclosure, reference is now made to the following description taken in conjunction with the accompanying drawings.

DETAILED DESCRIPTION

Figure 3:
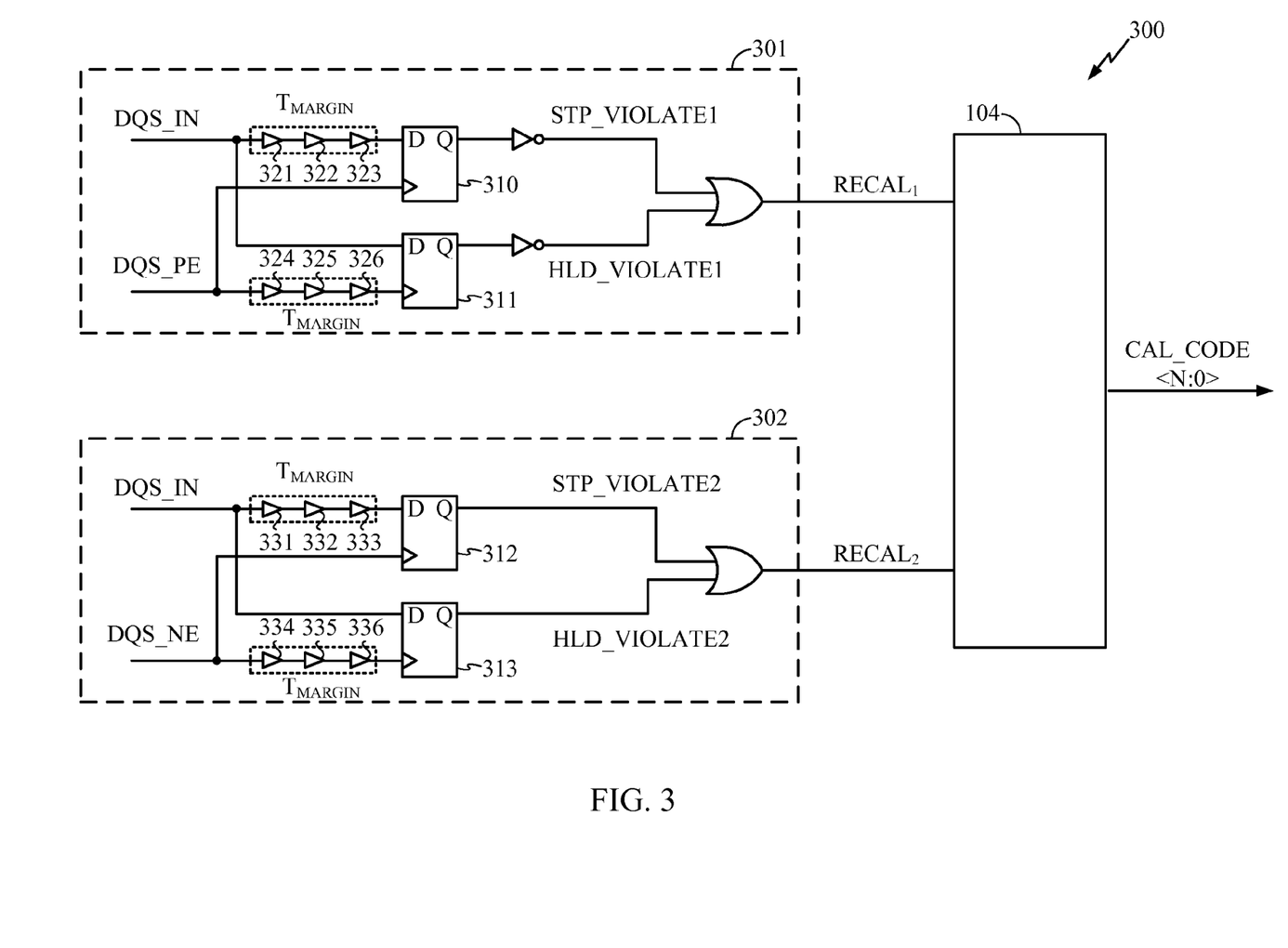
FIG. 3 is an illustration of an exemplary system adapted according to one embodiment.

FIG. 3 is an illustration of an exemplary system 300 adapted according to one embodiment. The system 300 includes two recalibration circuits 301, 302. The recalibration circuit 301 initiates recalibration of the CDC 100 (FIG. 1) when the recalibration circuit 301 discerns that the positive delayed strobe signal is within a predetermined proximity of an edge of the strobe signal. Similarly, the recalibration circuit 302 initiates recalibration of the CDC 100 (FIG. 1) when the recalibration circuit 302 discerns that the negative delayed strobe signal is within a predetermined proximity of an edge of the strobe signal. Specifically, as shown in FIG. 3, each recalibration circuit 301 and 302 is independently operable to send a respective RECAL signal to the calibration engine 104, thereby indicating to the calibration engine 104 to begin a recalibration operation. In this embodiment, the positive and negative delays are independently recalibrated based upon respective $RECAL_1$ and $RECAL_2$ signals. In other embodiments, both positive and negative delay can be recalibrated based upon a single RECAL signal.

The embodiment shown in FIG. 3 exploits the nominally edge-aligned characteristic of the incoming double-data rate data and the strobe (DQ<7:0> and DQS_IN respectively in FIG. 1). In other words, the rising and falling edges of DQS_IN nominally correspond to transitions of the data signal DQ<7:0>. Therefore, the DQS_IN signal can be used as a stand-in for the data signal (DQ<7:0>) for this embodiment.

In the recalibration circuit 301, the STP_VIOLATE1 signal goes HIGH if the rising edge of DQS_PE drifts to within $T_{STP}+T_{MARGIN}$ of the rising edge of DQS_IN. The HLD_VIOLATE1 signal goes HIGH if the rising edge of DQS_PE drifts to within $T_{HLD}+T_{MARGIN}$ of the falling edge of DQS_IN. Either of such conditions cause a recalibration operation to be initiated by making the $RECAL_1$ signal go high. The recalibration circuit 302 uses a similar scheme to check timing on the DQS_NE strobe and initiates a recalibration operation if appropriate.

Turning attention now to the operation of the latching circuits 310-313, it is noted that output of the latching circuit 310 will be high (and STP_VIOLATE1 will be low) as long as rising edge of DQS_PE is delayed by at least $T_{STP}+T_{MARGIN}$ with respect to rising edge of DQS_IN. For example, if the supply voltage increases by a large enough amount, then the delay produced by the programmable delay array 101 will be much less than $T_{SD}$ and the rising edge of DQS_PE may come close to the left edge of the data valid window. In other words, in such a scenario, the rising edge of DQS_PE may be within $T_{STP}+T_{MARGIN}$ of the rising edge of DQS_IN. This will trigger a setup time violation on the latching circuit 310, potentially causing the output of the latching circuit 310 to go low and STP_VIOLATE1 to go high. Similarly, the output of the latching circuit 311 will be high (and HLD_VIOLATE1 will be low) as long as rising edge of DQS_PE occurs at least $T_{HLD}+T_{MARGIN}$ before the falling edge of DQS_IN. For example, if the supply voltage decreases by a large enough amount, then the delay produced by the programmable delay array 101 will be much larger than $T_{SD}$ and rising edge of DQS_PE may come closer to the right edge of the data valid window. In other words, the rising edge of DQS_PE may be within $T_{HLD}+T_{MARGIN}$ of the falling edge of DQS_IN. This will trigger a hold time violation on the latching circuit 311 potentially causing the output of the latching circuit 311 to go low and HLD_VIOLATE1 to go high. The recalibration circuit 302 operates in the same manner as that described above with respect to the recalibration circuit 301, though the recalibration circuit 302 reacts to changes in the rising edge of DQS_NE.

Of note in the embodiment of FIG. 3, the latching circuits 310-313 are replicas of the latching circuits 102 and 103 used to capture the data as DQO_PE and DQO_NE. Such characteristic may help to ensure that the latching circuits 310-313 have substantially the same setup/hold requirements as the latching circuits 102 and 103. However, other embodiments may use other than exact replicas as long as the setup and hold time requirements are substantially the same. Also, the delay elements 321-326 and 331-336 used to generate the delay, $T_{MARGIN}$, are replicas of the same delay elements in the programmable delay array 101 (FIG. 1). However, it is not required of all embodiments that the delay elements 321-336 and 331-336 be replicas of the delay elements used in the programmable delay array 101. In some embodiments, such feature is provided for the convenience of design re-use, as the delay elements in the programmable delay array 101 may have already been rigorously simulated across PVT variations and may be known to produce a certain minimum $T_{MARGIN}$ across PVT variations.

Figure 4:
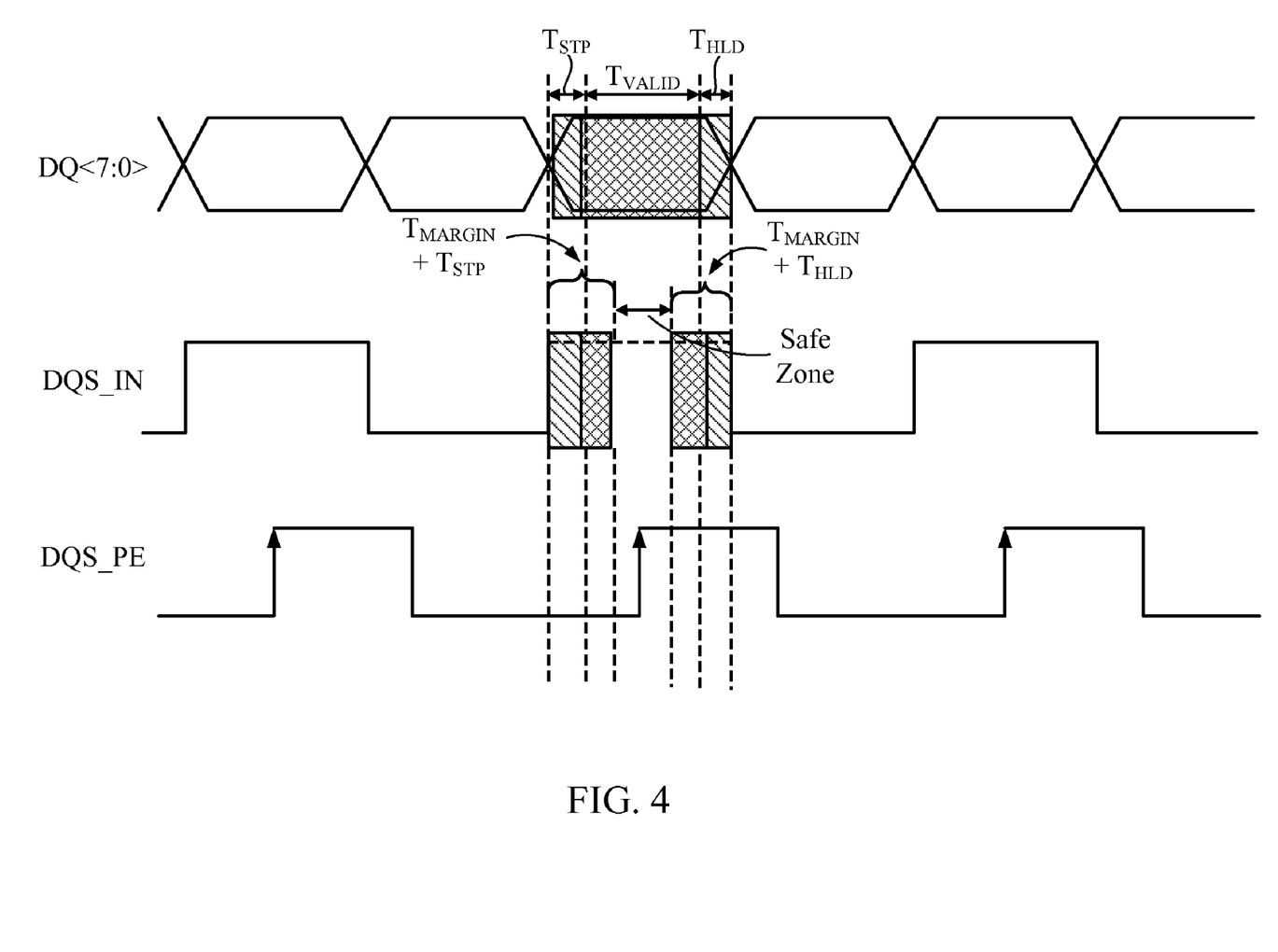
FIG. 4 is an illustration of waveforms associated with the system of FIG. 3.

FIG. 4 is an illustration of waveforms associated with the recalibration circuit 301 of the system 300, showing the placement of the rising edge of DQS_PE relative to DQS_IN in one example. It is understood that the recalibration circuit 302 is associated with a similar set of waveforms where the rising edge of DQS_NE is positioned relative to the edges of DQS_IN. As shown in FIG. 4, $T_{MARGIN}$ is a delay that extends into the data valid window. The example embodiment of FIG. 3 presents a technique for sensing when the delayed strobes (DQS_PE and DQS_NE) "wander" near the edges of the data valid window ($T_{VALID}$) due to changes in supply voltage or operating temperature. When such a condition is detected, the recalibration circuit 301 and/or the recalibration circuit 302 initiates a recalibration operation after which the new calibration code is loaded into the delay array. However, minor changes in supply voltage or temperature that cause a delayed strobe (DQS_PE/DQS_NE) to wander within the "safe zone" of the data valid window (the safe zone being bounded by the delays $T_{STP}+T_{MARGIN}$ and $T_{HLD}+T_{MARGIN}$ in FIG. 4) do not initiate a recalibration operation.

While FIG. 3 shows one specific embodiment of recalibration circuits, the scope of embodiments is not so limited. For instance, other embodiments may include a different number, or a selectable number, of delay elements to make $T_{MARGIN}$. In some embodiments, $T_{MARGIN}$ can be adjusted to increase or decrease the safe zone of the data valid window shown in FIG. 4. Increasing the safe zone reduces the number of recalibration operations at the expense of reliability of the latched data, whereas decreasing the safe zone of the valid window may decrease the number of read errors at the expense of increasing the number of recalibration operations.

Figure 5:
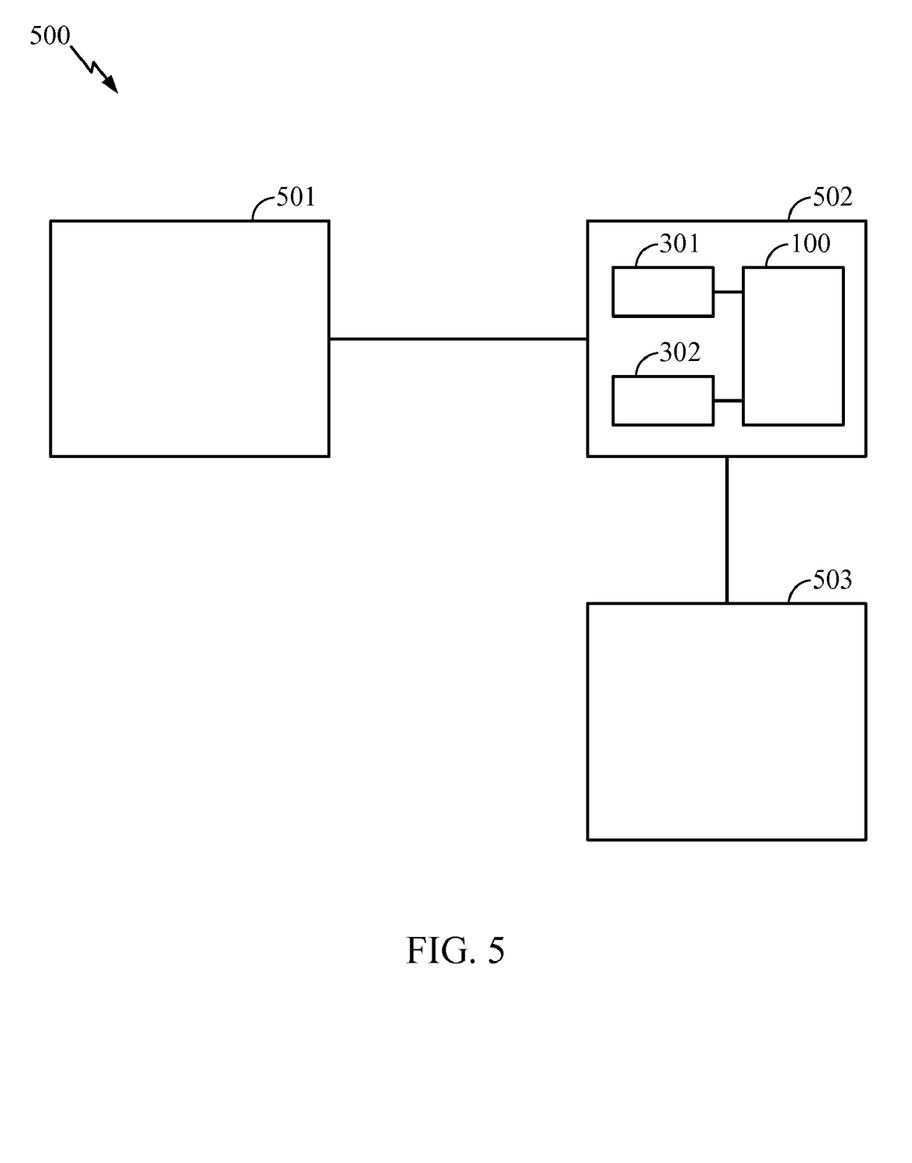
FIG. 5 is an illustration of an exemplary system adapted according to one embodiment.

FIG. 5 is an illustration of an exemplary system 500 adapted according to one embodiment. The system 500 includes a processor 501, which can be any kind of processor, such as a general purpose processor, a Digital Signal Processor (DSP), Application Specific Integrated Circuit (ASIC), or the like, according to a given embodiment.

The system 500 also includes the memory module 503, which, in some embodiments, includes DDR SDRAM, though various embodiments are applicable to DDR RAM in general. The interface module 502 provides a high-speed Input/Output (I/O) interface between the processor 501 and the memory module 503. The interface module 502 includes the CDC 100 in communication with recalibration circuits 301, 302, thereby providing reliable strobe delays in the READ path. In some embodiments, the recalibration circuits 301, 302 are in communication with the calibration engine 104 (FIG. 1), triggering the calibration engine 104 to recalibrate upon receipt of a RECAL signal.

FIG. 5 shows the recalibration circuits 301, 302 in communication with the CDC 100, but the scope of embodiments is not so limited. For instance, in some embodiments, the RECAL signal is received by another circuit or software code (executing on a processing circuit) that then triggers a recalibration operation. Various embodiments are not limited to the particular architectures for arrangement of the recalibration circuits relative to the CDC 100 that are shown in FIGS. 3 and 5. Furthermore, specific structures for recalibration circuits may differ in other systems yet fall within the scope of embodiments. For instance, in many embodiments, the interface module 502 is integrated into the processor 501, though various embodiments may be adapted for any other architecture now known or later developed.

Figure 6:
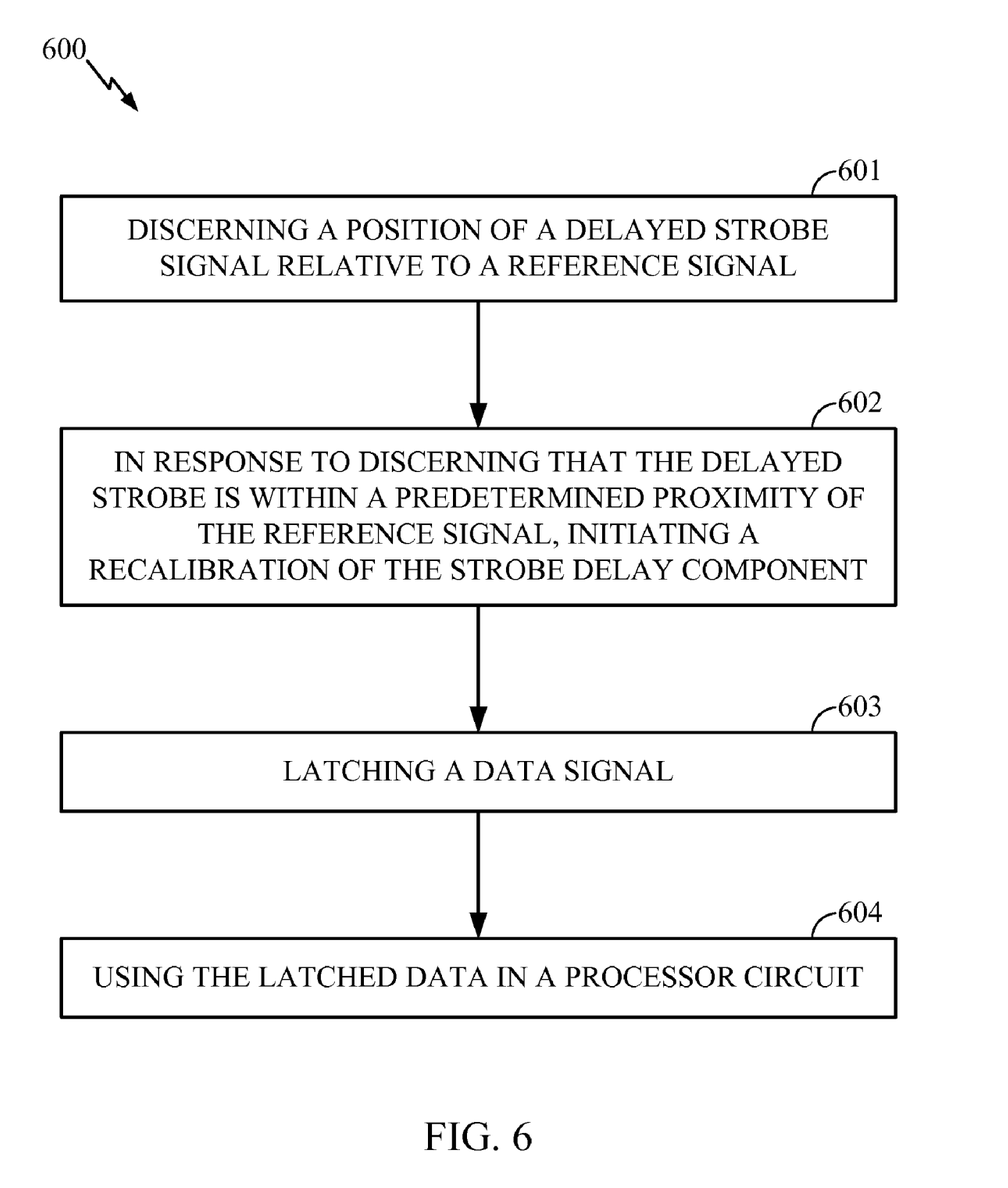
FIG. 6 is an illustration of an exemplary process adapted according to one embodiment.

FIG. 6 is an illustration of process 600 adapted according to one embodiment. The process 600 may be performed, for example, by a processor-based device that has a processor, a memory, and an interface therebetween, and operates according to the principles described above with respect to FIGS. 3 and 4.

In block 601, a position of a delayed strobe signal relative to a reference signal is discerned. In one example, the position of the delayed strobe signal relative to a strobe signal is discerned when the strobe signal is nominally aligned with the edge of the data signal. In other words, some embodiments discern the position of an edge of a delayed strobe signal relative to a nominal edge of a data signal latched using the delayed strobe signal.

In block 602, in response to discerning that the delayed strobe is within a predetermined proximity of the reference signal, a recalibration of the strobe delay component is initiated. In embodiments that include two delayed strobes (e.g., a positive and a negative delayed strobe) one or both of the delayed strobes may be recalibrated.

In block 603, the data signal is latched. In various embodiments, a processor uses the delayed strobe to trigger the latching. In block 604, the processor uses the latched data. For instance, the processor may process and transform the data, put the data into packets and transmit the packets, and/or the like. The scope of embodiments is not limited to any particular use of the latched data by the processor.

Process 600 is shown as a series of discrete actions, but the scope of embodiments is not so limited. Some embodiments may add, omit, rearrange, and/or modify the actions of process 600. For instance, in some embodiments, a recalibration circuit may be agnostic as to whether latching and processing actually occur; thus, some embodiments may see the actions of blocks 603 and 604 as optional.

Various embodiments include advantages over conventional proposals for recalibration. For instance, the embodiment of FIG. 3 suspends memory access operations when the delayed strobes approach the boundaries of the data valid window, rather than suspending memory access operations in response to insignificant movements of the delayed strobes. Also, the embodiment of FIG. 3 triggers the calibration engine 104 occasionally, rather than continuously, thereby saving power.

Figure 7:
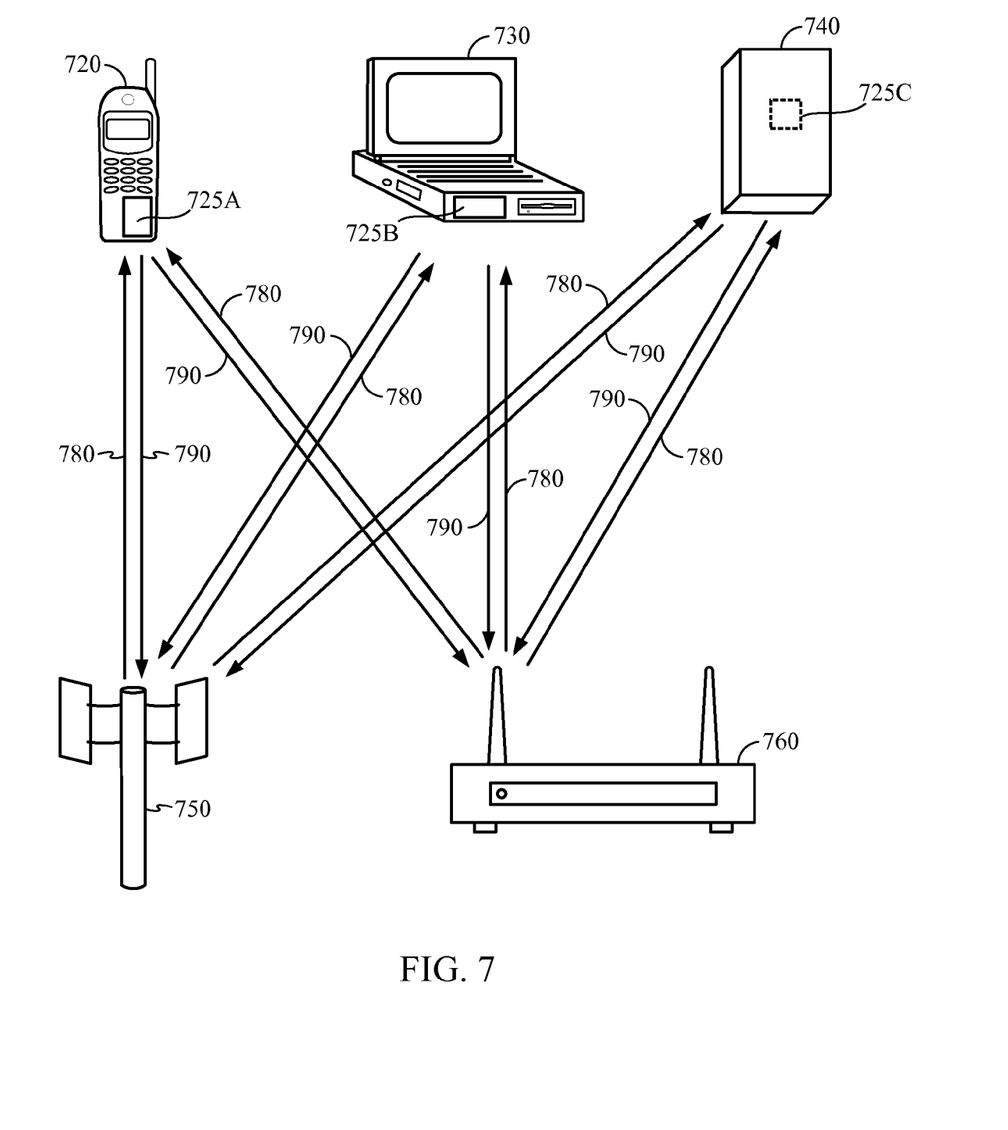
FIG. 7 shows an exemplary wireless communication system in which an embodiment of the disclosure may be advantageously employed.

FIG. 7 shows an exemplary wireless communication system 700 in which an embodiment of the disclosure may be advantageously employed. For purposes of illustration, FIG. 7 shows three remote units 720, 730, and 740 and two base stations 750, 760. It will be recognized that wireless communication systems may have many more remote units and base stations. The remote units 720, 730, and 740 include improved memory interfaces 725A, 725B, and 725C, respectively, according to the embodiments discussed in more detail above. While not shown in FIG. 7, it is understood that memory interfaces, according to the embodiments discussed above, can be included in base stations 750, 760 as well. FIG. 7 shows the forward link signals 780 from the base stations 750, 760 and the remote units 720, 730, and 740 and the reverse link signals 790 from the remote units 720, 730, and 740 to base stations 750, 760.

In FIG. 7, the remote unit 720 is shown as a mobile telephone, the remote unit 730 is shown as a portable computer, and the remote unit 740 is shown as a computer in a wireless local loop system. For example, the remote unit 720 may include mobile devices, such as cell phones, hand-held personal communication systems (PCS) units, portable data units such as personal data assistants. The remote unit 720 may also include fixed location data units such as meter reading equipment. Although FIG. 7 illustrates remote units according to the teachings of the disclosure, the disclosure is not limited to these exemplary illustrated units. The disclosure may be suitably employed in any device which includes a memory interface.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, including compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory interface circuit comprising:
   a delay module receiving a strobe signal and producing a delayed strobe signal therefrom; and
   a calibration module that initiates recalibration of the delay module when the calibration module discerns that the delayed strobe signal is within a predetermined proximity of an edge of a reference signal.

2. The memory interface circuit of claim 1 in which the delayed strobe signal comprises:
   a positive delayed strobe signal; and
   a negative delayed strobe signal.

3. The memory interface circuit of claim 2 in which the calibration module initiates recalibration of the delay module when at least one of the positive delayed strobe signal and the negative delayed strobe signal are within the predetermined proximity of an edge of the reference signal.

4. The memory interface circuit of claim 1 in which the predetermined proximity comprises at least one of:
   a first margin that includes a setup time associated with the incoming data; and
   a second margin that includes a hold time associated with the incoming data.

5. The memory interface circuit of claim 1 in which the delay module comprises:
   a first plurality of selectable delay elements.

6. The memory interface circuit of claim 5 in which the calibration module includes a second plurality of delay elements that are replicas of the first plurality of delay elements.

7. The memory interface circuit of claim 1 further comprising a latching module latching incoming data according to the delayed strobe signal, in which the latching module includes a first plurality of latching elements.

8. The memory interface circuit of 7 in which the calibration module includes a second plurality of latching elements that are replicas of the first plurality of latching elements.

9. The memory interface circuit of claim 1, in which the reference signal comprises:
   the strobe signal.

10. The memory interface circuit of claim 9 further comprising a latching module latching incoming data according to the delayed strobe signal, in which edges of the strobe signal are nominally aligned with edges of the incoming data.

11. The memory interface circuit of claim 1 incorporated into a device selected from a group consisting of a music player, a video player, an entertainment unit, a navigation device, a communications device, a personal digital assistant (PDA), a fixed location data unit, and a computer.

12. The memory interface circuit of claim 1, in which the memory interface circuit is integrated into a semiconductor die.

13. A method for use in a memory interface circuit that includes a strobe delay component, the method comprising:
   discerning a position of a delayed strobe signal relative to a reference signal; and
   in response to discerning that the delayed strobe signal is within a predetermined proximity of the reference signal, initiating a recalibration of the strobe delay component.

14. The method of claim 13, in which the reference signal comprises:
   a nominal edge of a data signal, the data signal being latched by the delayed strobe signal.

15. The method of claim 14, in which the nominal edge of the data signal corresponds to an edge of an undelayed strobe signal upon which the delayed strobe signal is based.

16. The method of claim 14 in which the data signal is received from a Double Data Rate Random Access Memory (DDR RAM).

17. The method of claim 13 further comprising:
   latching the data signal; and
   using the latched data signal in a processor circuit.

18. A memory interface module comprising:
   means for receiving a strobe signal and producing a delayed strobe signal therefrom; and
   means for initiating recalibration of the delay producing means when it is discerned that the delayed strobe signal is within a predetermined proximity of an edge of a reference signal.

19. The memory interface module of claim 18, in which the reference signal comprises:

the strobe signal.

20. The memory interface module of claim 18 further comprising means for latching incoming data according to the delayed strobe signal, in which the strobe signal corresponds to a nominal edge of the incoming data.

21. The memory interface module of claim 18 incorporated into a device selected from a group consisting of a music player, a video player, an entertainment unit, a navigation device, a communications device, a personal digital assistant (PDA), a fixed location data unit, and a computer.

22. The memory interface module of claim 18, in which the memory interface module is integrated into a semiconductor die.

23. A method for use in a memory interface circuit that includes a strobe delay component, the method comprising the steps of:

discerning a position of a delayed strobe signal relative to a reference signal; and in response to discerning that the delayed strobe signal is within a predetermined proximity of the reference signal, initiating a recalibration of the strobe delay component.

* * * * *